US007868362B2

(12) United States Patent
Randazzo et al.

(10) Patent No.: US 7,868,362 B2
(45) Date of Patent: Jan. 11, 2011

(54) SOI ON PACKAGE HYPERSENSITIVE SENSOR

(75) Inventors: Todd Andrew Randazzo, Mound, MN (US); Ronald James Jensen, Bloomington, MN (US); Thomas Keyser, Plymouth, MN (US)

(73) Assignee: Honeywell International Inc., Morristown, NJ (US)

( * ) Notice: Subject to any disclaimer, the term of this patent is extended or adjusted under 35 U.S.C. 154(b) by 201 days.

(21) Appl. No.: 12/252,452

(22) Filed: Oct. 16, 2008

(65) Prior Publication Data

US 2009/0096113 A1  Apr. 16, 2009

Related U.S. Application Data

(60) Provisional application No. 60/980,346, filed on Oct. 16, 2007.

(51) Int. Cl.
*H01L 27/148*  (2006.01)

(52) U.S. Cl. .............................. 257/226; 257/E21.122; 257/233; 257/292; 257/778; 438/30; 438/48

(58) Field of Classification Search .......... 257/E23.068, 257/E23.067, E21.122, E21.216, 144, 226, 257/233, 234, 252, 253, 288, 292, 293, 778–780; 438/30, 48, 49, 800; 204/416, 419; 349/187
See application file for complete search history.

(56) References Cited

U.S. PATENT DOCUMENTS

| 5,281,822 | A |   | 1/1994  | Albrecht et al. ........ 250/370.05 |
|-----------|---|---|---------|------------------------------------|
| 5,319,210 | A |   | 6/1994  | Moscovitch ................ 250/474 |
| 5,444,301 | A |   | 8/1995  | Song et al. .................. 257/737 |
| 5,807,783 | A | * | 9/1998  | Gaul et al. .................. 438/406 |
| 5,972,725 | A |   | 10/1999 | Wollesen et al. ............... 438/14 |
| 6,075,261 | A |   | 6/2000  | Hossain et al. ............... 257/252 |
| 6,093,331 | A |   | 7/2000  | Wollesen ........................ 216/2 |
| 6,355,501 | B1| * | 3/2002  | Fung et al. ................... 438/107 |
| 6,387,724 | B1| * | 5/2002  | Walker ........................ 438/49 |
| 6,414,335 | B1|   | 7/2002  | Goruganthu et al. .......... 257/48 |

(Continued)

FOREIGN PATENT DOCUMENTS

WO    WO 2005/088719 A1    9/2005

(Continued)

OTHER PUBLICATIONS

Barthe, Jean. "Electronic Dosimeters Based on Solid State Detectors," Nuclear Instruments and Methods in Physics Research B 184 (2001) 158-189, 2001 Elsevier Science B.V.

(Continued)

*Primary Examiner*—Chris Chu
(74) *Attorney, Agent, or Firm*—Shumaker & Sieffert, P.A.

(57) ABSTRACT

A hypersensitive semiconductor die structure is disclosed, in which flip-chip packaging is used in conjunction with a modified SOI die in which a thick silicon support substrate has been removed to increase sensitivity of the sensing device. Rather than being located beneath layers of interconnects and dielectric, the disclosed structure places the sensing devices close to the surface, more closely exposed to the environment in which sensing is to occur. The structure also allows for the placement of sensing films on nearer to the sensing devices and/or an oxide layer overlying the sensing devices.

20 Claims, 4 Drawing Sheets

U.S. PATENT DOCUMENTS

| | | | |
|---|---|---|---|
| 6,472,760 B1 | 10/2002 | Birdsley et al. | 257/778 |
| 6,518,783 B1 | 2/2003 | Birdsley et al. | 324/763 |
| 6,621,281 B1 | 9/2003 | Birdsley et al. | 324/751 |
| 6,621,288 B1 | 9/2003 | Bruce et al. | 324/765 |
| 6,635,572 B1 | 10/2003 | Goruganthu et al. | 438/689 |
| 6,716,683 B1 | 4/2004 | Bruce et al. | 438/151 |
| 6,765,978 B1 | 7/2004 | Kronenberg et al. | 376/147 |
| 6,833,716 B1 | 12/2004 | Goruganthu et al. | 324/750 |
| 6,841,841 B1 | 1/2005 | Blish, II et al. | 257/429 |
| 6,867,444 B1 | 3/2005 | Hughes | 257/252 |
| 6,909,159 B2 | 6/2005 | Friend et al. | 257/428 |
| 7,019,511 B1 | 3/2006 | Birdsley et al. | 324/96 |
| 7,075,165 B2* | 7/2006 | Leon et al. | 257/458 |
| 7,196,800 B1 | 3/2007 | Birdsley et al. | 326/505 |
| 7,235,800 B1 | 6/2007 | Goruganthu et al. | 250/492.3 |
| 7,265,359 B2 | 9/2007 | Ambrosi et al. | 250/390.01 |
| 7,271,389 B2 | 9/2007 | August et al. | 250/370.05 |
| 7,335,891 B2 | 2/2008 | Kniss et al. | 250/370.11 |
| 7,365,436 B2* | 4/2008 | Yamano | 257/774 |
| 7,378,702 B2* | 5/2008 | Lee | 257/296 |
| 7,470,598 B2* | 12/2008 | Lee | 438/455 |
| 7,485,511 B2* | 2/2009 | Yamada et al. | 438/160 |
| 7,576,369 B2* | 8/2009 | Bui et al. | 257/127 |
| 2004/0227094 A1 | 11/2004 | Tompa et al. | 250/370.01 |
| 2007/0023888 A1* | 2/2007 | Fujii | 257/698 |
| 2008/0017804 A1 | 1/2008 | Krishnamoorthy et al. | 250/370.05 |

FOREIGN PATENT DOCUMENTS

| | | |
|---|---|---|
| WO | WO 2006/085307 A1 | 8/2006 |
| WO | WO 2005/076779 A1 | 8/2008 |

OTHER PUBLICATIONS

Bartlett et al., "Active Neutron Personal Dosemeters—A Review of Current Status," Radiation Protection Dosimetry, vol. 86, No. 2, pp. 107-122 (1999) Nuclear Technology Publishing.

* cited by examiner

*Background*

*Background*

*Background*

SOI ON PACKAGE HYPERSENSITIVE SENSOR

RELATED APPLICATION

This application claims priority to U.S. Provisional Application No. 60/980,346, "SOI On Package Hypersensitive Intrusion Amplifier," the entirety of which is incorporated by reference herein.

FIELD OF THE INVENTION

This invention relates to an SOI flip-chip interconnected semiconductor structure that enhances sensitivity for sensor applications and allows for the placement of additional circuit patterns at very close proximity to the semiconductor elements without disturbing interconnectivity with the chip package.

BACKGROUND OF INVENTION

Batch wafer semiconductor process technologies have been heavily exploited not only to produce large scale integrated circuits, but a vast assortment of sensors and actuators as well. These include chemical sensors, photo detectors, radiation sensors, pressure transducers, temperature sensors, accelerometers, magnetic sensors, micro capillaries, micro mechanical devices, and many others. As semiconductor technologies advance and include increasing numbers of elements in a single "chip", increasing numbers of layers of interconnect and their associated isolation dielectrics and passivation have become more common. In 150 nm generation technologies, 6-8 layers of copper, aluminum, or tungsten interconnect separated by low-capacitance dielectrics are not uncommon.

FIG. 1 is a cross-sectional view of such technology 100, showing a thick support silicon 102, a plurality of semiconductor devices (e.g. field-effect transistors) 104, an interconnect and dielectric stack 106, a protective passivation dielectric 108, and pads 110. The illustrated technology 100 of FIG. 1 is a simplified representation only and is intended to show relative placement. Additional or fewer features, layers, and or interconnects will likely be included in an actual device and/or wafer.

Complex semiconductor devices such as memory chips or microprocessors typically have many electrical connections (power, ground, input and output and bidirectional signals, extrinsic passive components, etc). With few exceptions, these electrical connections (signals) are brought to the "outside world" through a protective package, and connections between the semiconductor chip and the package are made through holes in the protective passivation to relatively large (2-6 mils) features on the top metal layer called "pads" (e.g. pads 110 in FIG. 1). At present there are two dominant methods for connecting the exposed top interconnect of these devices to the package. The first, illustrated in FIG. 2, is referred to as "wirebond" packaging. Wirebond packaging refers to attaching very thin conductive wires 202 between the metal pads 110 of the chip 100 and their appropriate conductive connections 204 in the package 206. In the case of wirebond the mechanical connection to the package is made from the bottom 208 of the semiconductor chip 100, while the electrical connections to the package are made from the top side 210 of the chip 100. The second, illustrated in FIG. 3, is referred to as "flip-chip" packaging. Flip-chip packaging refers to forming conducting bumps 302 on the exposed pads 110, flipping the chip 100 upside down, and placing those bumps 302 in direct connection with their associated conductive connections 304 in the package 306. Often an appropriate thermal process is used to partially melt the bumps 302 during the die attach step, so that the bumps 302 form good conductive and mechanical connection to their associated connections 304 in the package 306. A mechanical underfill or adhesive 308 may also be used to fill in the gaps between bumps 302. In the case of flip-chip packaging, mechanical and electrical connections to the package are made from the same side—the inverted top side 310 of the chip 100.

Wirebond has been the dominant approach to integrated circuit packaging until recently. Flip-chip is rapidly gaining acceptance for at least four reasons. 1) The relatively high inductance of bond wires introduces crosstalk, noise, and signal integrity issues. 2) Flip-chip affords more options for getting heat (generated as the semiconductor devices burn power) out of the package. 3) Wirebond necessitates that the electrical connections to the chip be organized in a ring around the chip's perimeter, while flip-chip affords the flexibility of making these electrical connections almost anywhere in the die, vastly increasing the number of possible electrical connections and the chip-design flexibility in where they may be placed. 4) Elimination of ball bonds, wires, and the package lid allows the overall thickness of the completed, packaged product to be reduced.

Regardless of whether flip-chip or wirebond is used, the presence of increasing numbers of layers of interconnect with increased pattern density is, in some cases, making it more difficult to use the underlying semiconductor elements in sensing applications. In addition, the ability in these fine-feature manufacturing technologies to incorporate additional films close to the underlying semiconductor devices suitable for sensing applications is limited by the complexity and sensitivity of the interconnect and isolation materials and structures.

Needed is a structure where the semiconductor devices are exposed for sensing applications, while the associated interconnect structures and their final connection to the package remain protected. Such a structure should be suitable for depositing additional films for the purpose of sensing without having to disturb the semiconductor, interconnect, passivation, or electrical package connection features.

SUMMARY

A hypersensitive semiconductor die structure is disclosed, in which flip-chip packaging is used in conjunction with a modified SOI die in which a thick silicon support substrate has been removed to increase sensitivity of the sensing device. Rather than being located beneath layers of interconnects and dielectric, the disclosed structure places the sensing devices close to the surface, more closely exposed to the environment in which sensing is to occur. The structure also allows for the placement of sensing films on nearer to the sensing devices and/or an oxide layer overlying the sensing devices.

DETAILED DESCRIPTION

SOI (Silicon On Insulator) is an implementation of batch wafer semiconductor process technology where the thin top silicon (0.01 um to 10 um thick) in which the semiconductor devices will be formed is isolated from the vast majority of the rest of the thickness of the wafer (5-40 mils thick, referred to here as the "substrate") by a dielectric layer (referred to as "buried oxide" or "BOX"). While SOI in various forms has been around for many years, most recently it is gaining acceptance in CMOS technologies. In the specific case of CMOS, SOI is desirable because it affords increased circuit density (the device spacings associated with junction isolation go away), improved circuit speed (due to reduced junction and interconnect capacitances), and reduced circuit power consumption (for the same reason). In accordance with various embodiments of the present invention, the buried oxide is exploited as an enabling fabrication feature rather than an electrical feature.

The presence of the buried oxide in SOI affords a level of fabrication flexibility not present in bulk. In accordance with embodiments of the invention, the buried oxide can serve as a highly selective "etch stop," allowing the bottom thick support wafer to be removed. The thin silicon, buried oxide, and associated interconnect features are aggregately quite thin (less than 1 mil) and likely require mechanical support. In addition, electrical connections are made to the metal pads of the device.

Figure 1:
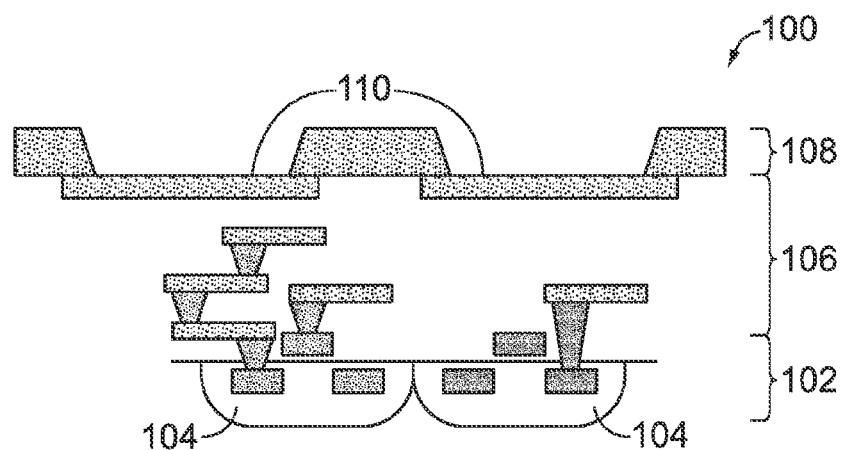
FIG. 1 is a simplified cross-sectional diagram showing a 150 nm-generation semiconductor chip.
Figure 2:
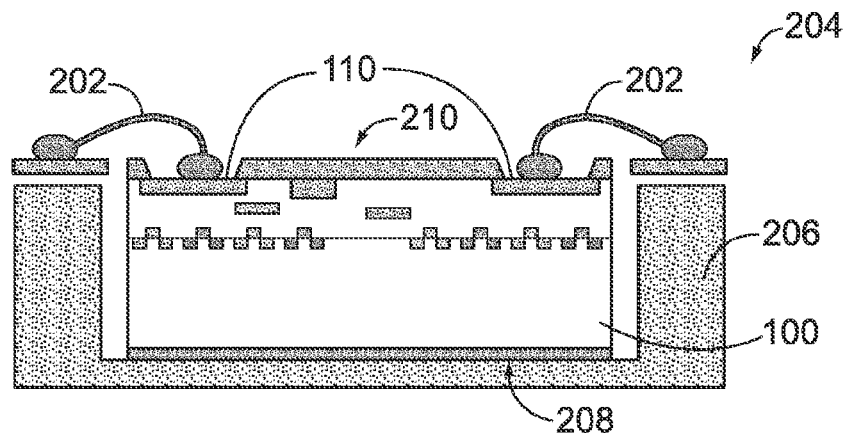
FIG. 2 is a simplified cross-sectional diagram showing a wirebond technique for packaging a semiconductor chip.
Figure 3:
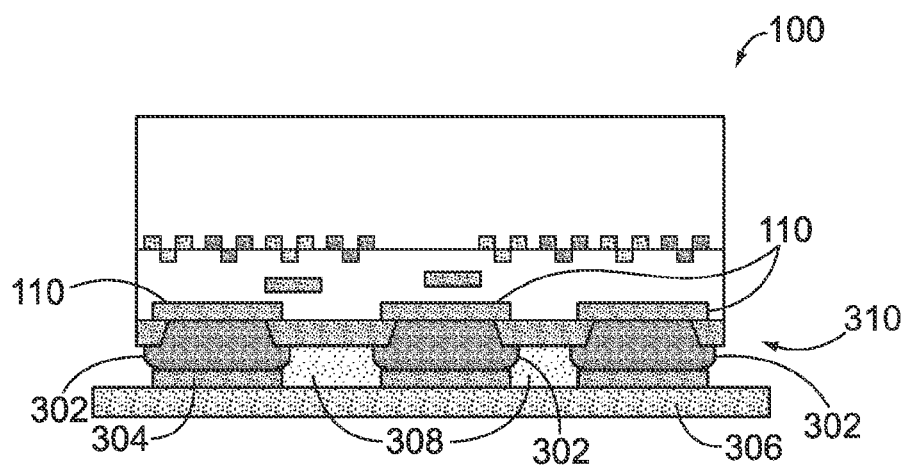
FIG. 3 is a simplified cross-sectional diagram showing a flip-chip technique for packaging a semiconductor chip.
Figure 4:
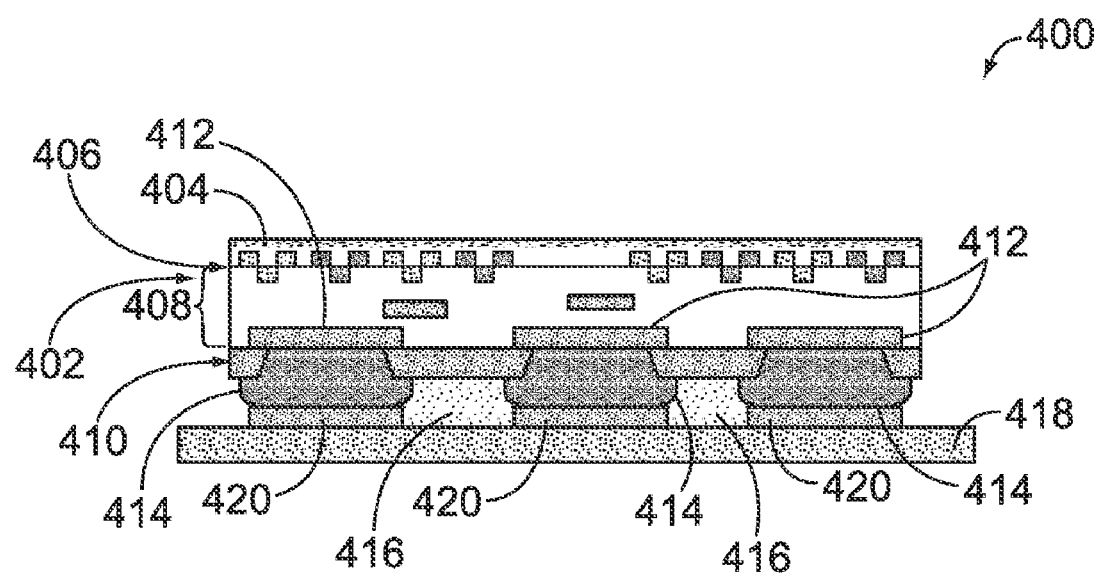
FIG. 4 is a simplified cross-sectional diagram showing a SOI On Package Hypersensitive Sensor structure in accordance with an embodiment of the present invention.

The proposed structure in accordance with preferred embodiments of the present invention is shown in FIG. 4. FIG. 4 is a simplified cross-sectional diagram showing a SOI On Package Hypersensitive Sensing Device structure 400 in accordance with an embodiment of the present invention. The structure 400 includes an SOI semiconductor chip 402 packaged using flip-chip technology (see the discussion associated with FIG. 3, above), with the thick bottom "substrate" support removed. This structure 400 may be referred to as a Silicon-on-insulator on-Package Hypersensitive Sensor structure. From top to bottom (with "top" referring to the portion of the chip 402 opposite the package 418), the structure 400 includes the buried oxide 404, the electrical device semiconductor layers 406, the interconnect and dielectric stack 408, passivation dielectric 410 (with pad openings), pads 412, conductive bumps 414, and optional mechanical underfill or adhesive 416 between bumps. The chip 402 is electrically connected to associated conductive connections 420 on the flip-chip package 418.

The structure 400 may be employed to particular advantage in sensor applications, such as those involving light or radiation sensors. The structure 400 may be used to cause the devices fabricated in the thin semiconductor layer to be far more exposed to what they are intended to detect than they otherwise would be if they were "shielded" by either the interconnect and passivation layers (formerly on the top, with respect to the semiconductor device layer) or the thick semiconductor substrate (formerly on the bottom, with respect to the semiconductor device layer). Furthermore, with the thick support silicon removed and the interconnect system and associated electrical package connections on the bottom (closest to the package), and the semiconductor devices exposed on top (opposite the package) it is now practical to deposit one or more layers (e.g. treated films, such as organic or biological films for environmental or biological applications) in very close proximity to the semiconductor devices formed in the thin semiconductor layer without interfering with the device construction or interconnect stack.

Figure 5:
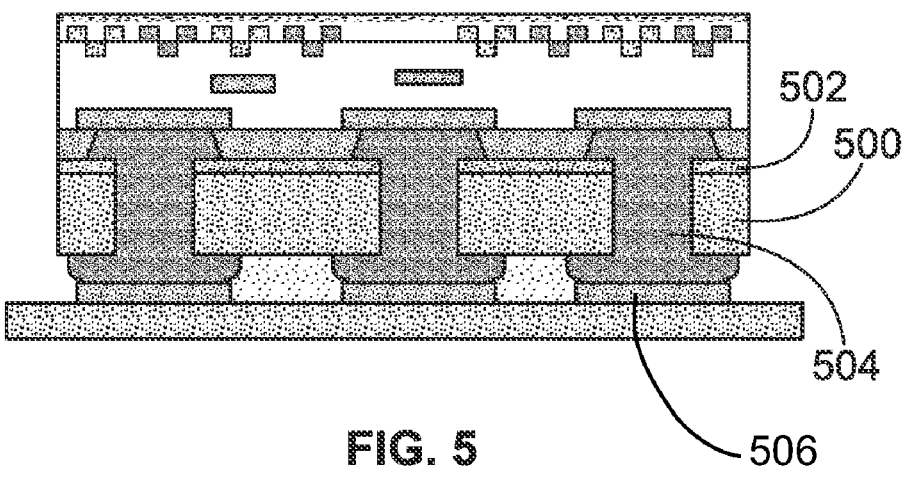
FIG. 5 is a simplified cross-sectional diagram showing a SOI On Package Hypersensitive Sensor structure in accordance with an alternative embodiment of the present invention.

From a fabrication standpoint, for some applications, it may be favorable to remove the bottom thick silicon substrate and deposit (in close proximity to the semiconductor devices) any layers that may be required for sensing while the chip 400 is still in wafer form (i.e. before sawing the wafer into individual chips and placing the chips in packages). This is particularly true if any of the additional deposited layers need to be patterned. In this case, as shown in FIG. 5, a mechanical support structure 500 may be attached (such as by adhesive 502) to what was once the top of the wafer (the portion closest to where the chip will attached to the package 418) prior to removal of the thick silicon substrate portion. To provide the electrical connection between the pads 412 on the chip 400 and the conducting connections 506 in the package, holes 504 are cut in this mechanical support structure. Such holes 504 could be cut either before or after attaching to the device wafer. At some point prior to packaging, these holes 504 are filled with a conducting material. The mechanical carrier cannot practically be removed and will remain through packaging. Thus, regardless of the specifics of fabrication the structure changes, as shown in FIG. 5. The primary difference between the structures of FIGS. 4 and 5 is the presence of the mechanical support structure in FIG. 5.

Depending upon what the final device is intended to sense and whether or not it requires the deposition of additional films in close proximity to the semiconductor devices, many variations may be made to the general device structures described above. For example, the structure may take the form of the structures shown in FIGS. 4 and 5, but with the buried oxide patterned, removed, or thinned, such as by an etch process. As another example, the structure may take the form of the structures shown in FIGS. 4 and 5, where one or more additional layers (such as sensing layers) have been deposited on top of the "buried oxide," possibly treated and/or possibly patterned. As yet another example, the structure may take the form of the structures shown in FIGS. 4 and 5, with the buried oxide patterned, removed, or thinned, where one or more additional layers have been deposited on top of the "buried oxide" (opposite the device layer) or device silicon, possibly treated and/or possibly patterned. The particular coatings and/or patterning will depend on the particular sensing application.

Figure 6:
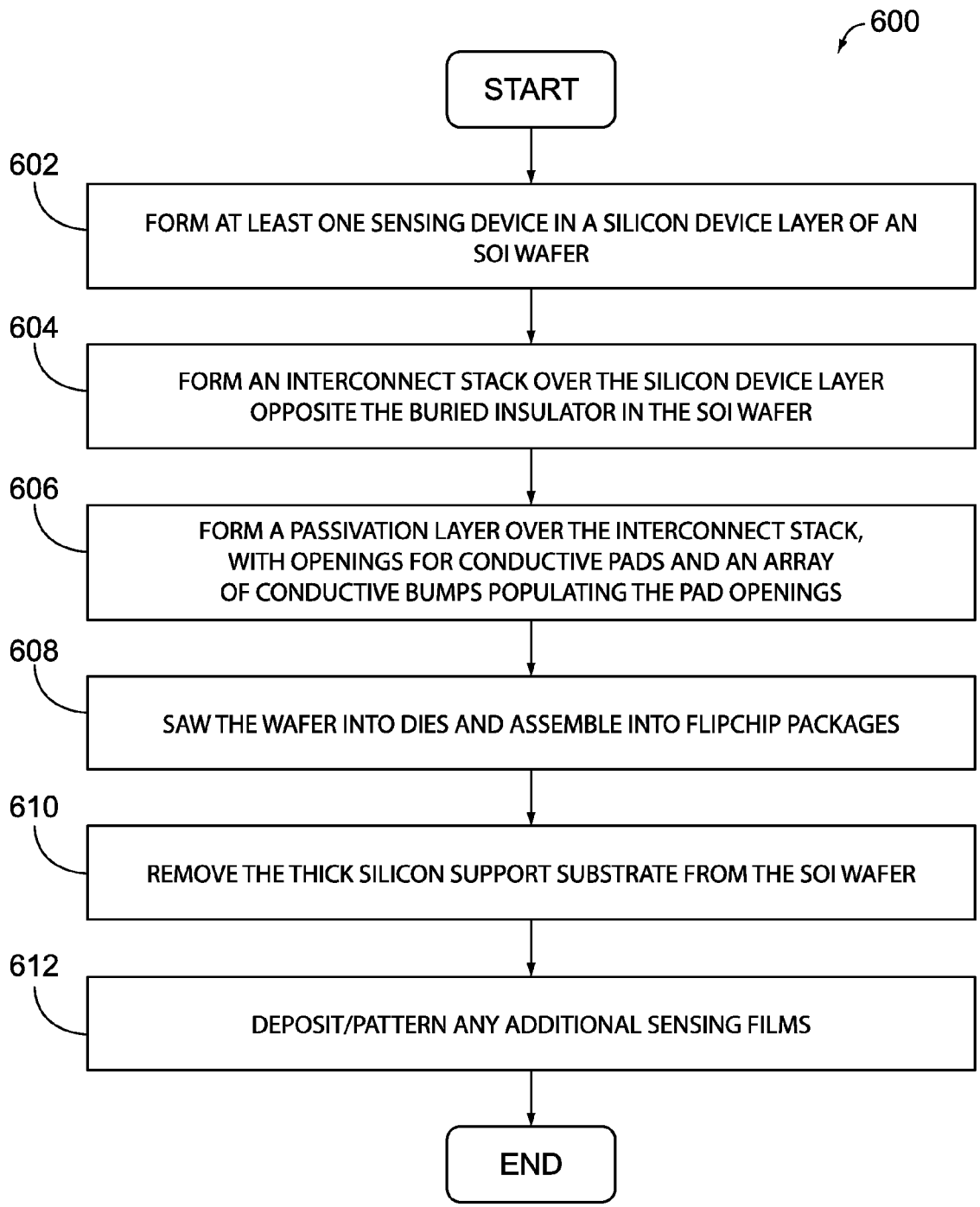
FIG. 6 is a flow diagram illustrated a process for fabricating a SOI On Package Hypersensitive Sensor structure in accordance with a first embodiment of the present invention.
Figure 7:
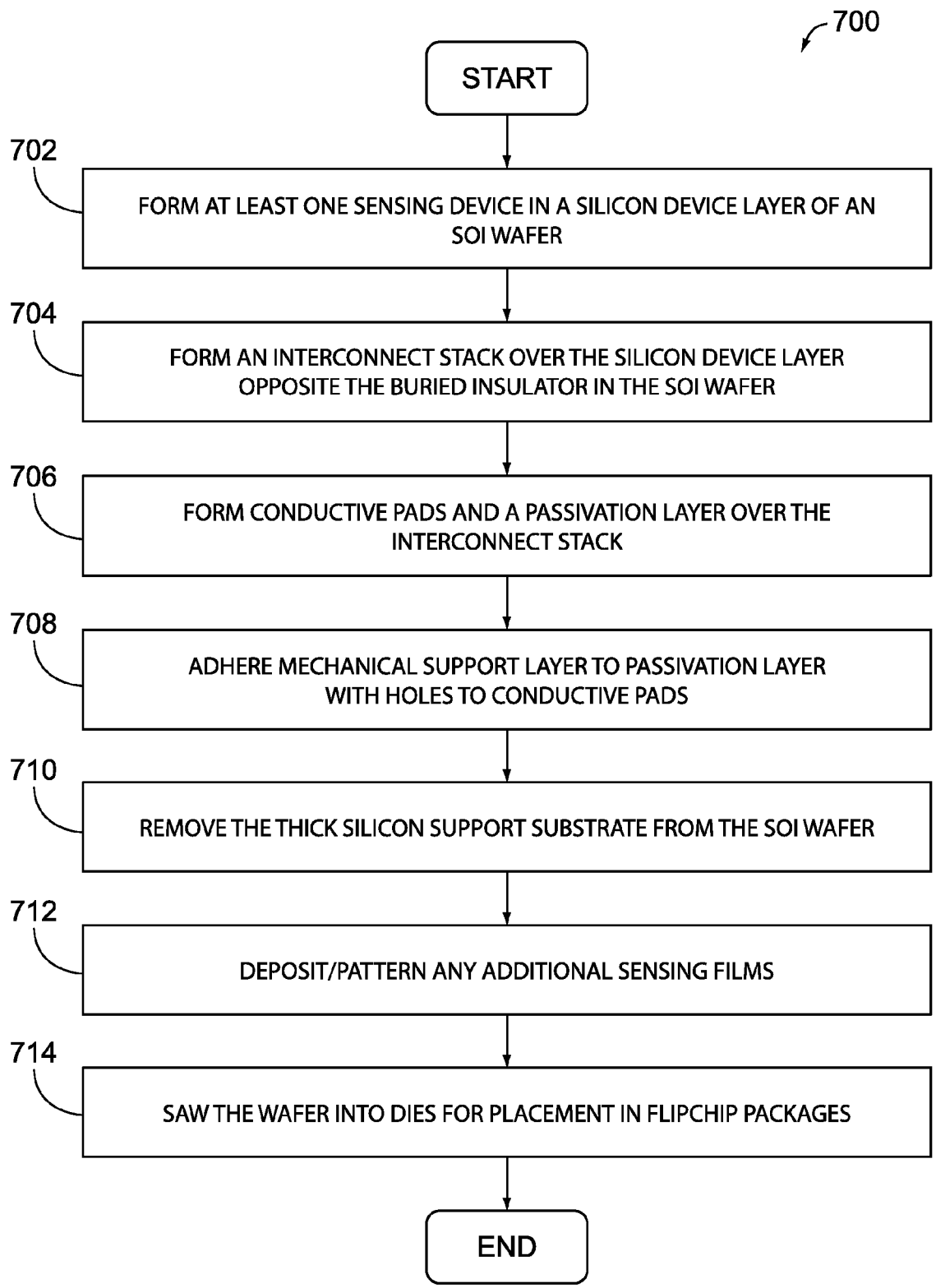
FIG. 7 is a flow diagram illustrated a process for fabricating a SOI On Package Hypersensitive Sensor structure in accordance with an alternative embodiment of the present invention.

FIGS. 6 and 7 are flow diagrams illustrating general process flows that may be used to fabricate the devices described above. FIG. 6 shows a process that may be used to fabricate the structure shown in FIG. 4, while FIG. 7 shows a process that may be used to fabricate the structure shown in FIG. 5. Other processes besides those shown in FIGS. 6 and 7 may be used, depending on the particular sensing application and stability of the sensing layers (if any) to be applied. The goal is for the resulting device structure to be a silicon based sensor mounted on a flip-chip package with backside silicon removed and optionally some or all of the buried oxide removed and optionally with one or more additional sensing-related films deposited in very close proximity (i.e. where the backside silicon and buried oxide previously resided) to the device silicon layer.

The process 600 of FIG. 6 includes the following steps. At least one sensor device is formed in a silicon device layer in an SOI wafer (having a thick silicon support substrate, a buried insulator layer, and a silicon device layer), as shown in block 602. In block 604, an interconnect stack is formed over the silicon device layer opposite the buried insulator in the SOI wafer. In block 606, a passivation layer is formed over the interconnect stack and conductive pads and conductive bumps are formed, for eventually connection to the flip-chip package. In block 608, the wafer is sawed into individual dies, which are assembled into flip-chip packages, with the conductive bumps forming the electrical connections between the conductive pads and conductive connections in the package. In block 610, the thick silicon substrate is removed, such as by etching, or a combination of mechanical and chemical processing. In block 612, any additional sensing films (e.g. treated films) necessary for the particular sensing application are deposited and possibly patterned. Steps 602-612 may be performed in an order other than as illustrated, according to some embodiments.

Blocks 702-706 of the process 700 of FIG. 7 are similar to blocks 602-606 of the process 600 of FIG. 6. In block 708, a mechanical support layer, such as a donor wafer, is adhered to the passivation layer by an adhesive. The mechanical support layer has holes mapped to the underlying conductive pads, so that electrical contact may be made to the conductive pads. The holes may be formed either before or after the mechanical support layer is adhered. A conductive material is placed in the holes to make the eventual electrical connection. Blocks 710-714 are similar to blocks 608-612 in the process 600.

Steps 702-714 of process 700 may be performed in an order other than as illustrated, according to some embodiments. For example, while block 712 of the process 700 describes applying/patterning any additional sensing films before sawing and assembly into flip-chip packages (block 714) takes place, this may not be possible if the additional sensing film(s) would not be stable in the subsequent sawing and assembly. This may be the case, for example, for some organic or biological films for certain environmental or medical sensing applications. In such a case, the sensing film(s) would likely be applied after sawing and assembly of the die into the flip-chip package. Similarly, removal of the thick support substrate could be performed after sawing and assembly, although the mechanical support layer adhered in block 708 is intended to make removal of the thick support substrate possible.

The specific processes one would use are standard processes. For example, selective silicon removal using Potassium Hydroxide (KOH) may be used to remove the thick silicon substrate, similar to silicon is removed to create diaphragms in pressure transducers. Standard flip-chip manufacturing techniques may be used for bumping and die attachment. Attachment of mechanical support "donor" wafers may be accomplished using known techniques, in order to provide the mechanical support structure 500 shown in FIG. 5. U.S. patent application Ser. No. 12/135,787, titled "Neutron Detection Structure," sets forth additional details on some of the processes that may be used to arrive at the structure described above, and is incorporated by reference herein in its entirety.

An SOI on flip-chip structure with the thick bottom silicon substrate removed has been described. The resulting structure promotes the hyper-sensitizing of the semiconductor elements in sensor applications. In addition, the structures serves as an enabling platform for placing additional films in very close proximity to the semiconductor elements while not disturbing the interconnect and package technology.

We claim:

1. A hypersensitive semiconductor die structure, comprising:
   a modified silicon-on-insulator (SOI) stack comprising a silicon device layer formed over a buried insulator layer, wherein the modified SOI stack is characterized by its absence of a silicon support substrate underlying the buried insulator layer opposite the silicon device layer;
   at least one sensing device formed in the silicon device layer, whereby the absence of the silicon support substrate increases sensitivity of the at least one sensing device;
   an interconnect stack formed over the silicon device layer opposite the buried insulator layer, the interconnect stack comprising a plurality of interconnect layers and a plurality of dielectric layers; and
   an array of conductive pads overlaying the interconnect stack, the array of conductive pads for making electrical connection to an array of conductive connections on a flip-chip package.

2. The hypersensitive semiconductor die structure of claim 1, wherein the modified SOI stack is further characterized by the buried insulator layer being patterned or thinned from its original thickness in an original SOI stack.

3. The hypersensitive semiconductor die structure of claim 1, wherein the modified SOI stack is further characterized by its absence of the buried insulator layer, leaving only the silicon device layer portion of an original SOI stack.

4. The hypersensitive semiconductor die structure of claim 1, further comprising a treated sensing film overlying the buried insulator layer opposite the silicon device layer, the treated sensing film being associated with the at least one sensing device to enable a sensing function.

5. The hypersensitive semiconductor die structure of claim 1, further comprising a patterned sensing film overlying the buried insulator layer opposite the silicon device layer, the patterned sensing film being associated with the at least one sensing device to enable a sensing function.

6. The hypersensitive semiconductor die structure of claim 1, wherein the array of conductive pads are electrically coupled to the array of conductive connections on the flip-chip package, thereby mounting the hypersensitive die structure in the flip-chip package.

7. The hypersensitive semiconductor die structure of claim 1, further comprising:
   a passivation layer overlaying the interconnect stack, the passivation layer having an array of pad openings for the conductive pads; and
   an array of conductive bumps in electrical contact with the conductive pads, for making electrical connection to the array of conductive connections on the flip-chip package.

8. A hypersensitive sensor, comprising:
   a flip-chip package comprising an array of conductive connections;
   a modified silicon-on-insulator (SOI) stack comprising a silicon device layer formed over a buried insulator layer, wherein the modified SOI stack is characterized by its absence of a silicon support substrate underlying the buried insulator layer opposite the silicon device layer;
   at least one sensing device formed in the silicon device layer, whereby the absence of the silicon support substrate increases sensitivity of the at least one sensing device;

an interconnect stack formed over the silicon device layer opposite the buried insulator layer, the interconnect stack comprising a plurality of interconnect layers and a plurality of dielectric layers; and an array of conductive pads overlaying the interconnect stack, the array of conductive pads for making electrical connection to the array of conductive connections on the flip-chip package.

9. The hypersensitive sensor of claim 8, wherein the modified SOI stack is further characterized by the buried insulator layer being patterned or thinned from its original thickness in an original SOI stack.

10. The hypersensitive sensor of claim 8, wherein the modified SOI stack is further characterized by its absence of the buried insulator layer, leaving only the silicon device layer portion of an original SOI stack.

11. The hypersensitive sensor of claim 8, further comprising a treated sensing film overlying the buried insulator layer opposite the silicon device layer, the treated sensing film being associated with the at least one sensing device to enable a sensing function.

12. The hypersensitive sensor of claim 8, further comprising a patterned sensing film overlying the buried insulator layer opposite the silicon device layer, the patterned sensing film being associated with the at least one sensing device to enable a sensing function.

13. The hypersensitive sensor of claim 8, further comprising a mechanical fill disposed between the conductive pads in the array of conductive pads.

14. The hypersensitive sensor of claim 8, further comprising:

a passivation layer overlaying the interconnect stack, the passivation layer having an array of pad openings for the conductive pads; and an array of conductive bumps populating the array of pad openings, the array of conductive bumps for making electrical connection to the array of conductive connections on the flip-chip package.

15. A hypersensitive semiconductor die structure, comprising:

a modified silicon-on-insulator (SOI) stack comprising a silicon device layer formed over a buried insulator layer, wherein the modified SOI stack is characterized by its absence of a silicon support substrate underlying the buried insulator layer opposite the silicon device layer;

at least one sensing device formed in the silicon device layer, whereby the absence of the silicon support substrate increases sensitivity of the at least one sensing device;

an interconnect stack formed over the silicon device layer opposite the buried insulator layer, the interconnect stack comprising a plurality of interconnect layers and a plurality of dielectric layers;

a passivation layer overlaying the interconnect stack, the passivation layer having an array of pad openings for making electrical contact with the interconnect stack; and a mechanical support layer overlaying the passivation layer, the mechanical support layer having an array of holes therein aligned with the array of pad openings, wherein the holes are filled with a conductive material and making electrical contact with the array of pad openings.

16. The hypersensitive semiconductor die structure of claim 15, wherein the modified SOI stack is further characterized by the buried insulator layer being patterned or thinned from its original thickness in an original SOI stack.

17. The hypersensitive semiconductor die structure of claim 15, wherein the modified SOI stack is further characterized by its absence of the buried insulator layer, leaving only the silicon device layer portion of an original SOI stack.

18. The hypersensitive semiconductor die structure of claim 15, further comprising a treated sensing film overlying the buried insulator layer opposite the silicon device layer, the treated sensing film being associated with the at least one sensing device to enable a sensing function.

19. The hypersensitive semiconductor die structure of claim 15, further comprising a patterned sensing film overlying the buried insulator layer opposite the silicon device layer, the patterned sensing film being associated with the at least one sensing device to enable a sensing function.

20. The hypersensitive semiconductor die structure of claim 15, further comprising an array of conductive bumps for making electrical connection between the interconnect stack and an array of conductive connections on a flip-chip package.

* * * * *